(12) United States Patent
Ivanov et al.

(10) Patent No.: US 6,939,403 B2
(45) Date of Patent: Sep. 6, 2005

(54) SPATIALLY-ARRANGED CHEMICAL PROCESSING STATION

(75) Inventors: Igor Ivanov, Dublin, CA (US); Chiu Ting, Saratoga, CA (US); Jonathan Weiguo Zhang, San Jose, CA (US); Arthur Kolics, San Jose, CA (US)

(73) Assignee: Blue29, LLC, Sunnyvale, CA (US)

( * ) Notice: Subject to any disclaimer, the term of this patent is extended or adjusted under 35 U.S.C. 154(b) by 17 days.

(21) Appl. No.: 10/299,069

(22) Filed: Nov. 19, 2002

(65) Prior Publication Data

US 2004/0094087 A1 May 20, 2004

(51) Int. Cl.[7] .............................................. B05C 11/02
(52) U.S. Cl. ............................................ 118/52; 64/66
(58) Field of Search ............................... 118/52, 66, 64, 118/72, 73, 503, 730; 438/908, 678; 427/443.1, 299, 240, 241; 204/212, 199; 134/33, 148, 153, 902

(56) References Cited

U.S. PATENT DOCUMENTS

| | | | |
|---|---|---|---|
| 5,830,805 A | | 11/1998 | Shacham-Diamand et al. |
| 5,989,342 A | | 11/1999 | Ikeda et al. |
| 6,267,853 B1 | | 7/2001 | Dordi et al. |
| 6,294,059 B1 | | 9/2001 | Hongo et al. |
| 6,322,677 B1 | | 11/2001 | Woodruff et al. |
| 6,589,338 B1 | * | 7/2003 | Nakamori et al. |

OTHER PUBLICATIONS

International Search Report, PCT/US03/36736, mailed Oct. 20, 2004.

* cited by examiner

Primary Examiner—Brenda A. Lamb
(74) Attorney, Agent, or Firm—Mollie E. Lettang; Daffer McDaniel, LLP

(57) ABSTRACT

The present invention discloses a station, e.g., for IC fabrication with a flexible configuration. It consists of an array of processing chambers, which are grouped into processing modules and arranged in a two-dimensional fashion, in vertical levels and horizontal rows, and is capable of operating independent of each other. Each processing chamber can perform electroless deposition and other related processing steps sequentially on a wafer with more than one processing fluid without having to remove it from the chamber. The system is served by a single common industrial robot, which may have random access to all the working chambers and cells of the storage unit for transporting wafers between the wafer cassettes and inlet/outlets ports of any of the chemical processing chambers. The station occupies a service-room floor space and a clean-room floor space. The processing modules and the main chemical management unit connected to the local chemical supply unit occupy a service-room floor space, while the robot and the wafer storage cassettes are located in a clean room. Thus, in distinction to the known cluster-tool machines, the station of the invention makes it possible to transfer part of the units from the expensive clean-room area to less-expensive service area.

6 Claims, 3 Drawing Sheets

SPATIALLY-ARRANGED CHEMICAL PROCESSING STATION

FIELD OF THE INVENTION

The present invention relates to semiconductor manufacturing equipment. More particularly, the invention relates to a spatially-arranged station for deposition from liquid media, e.g, to an electroless deposition station that contains a plurality of individual and independently operating chemical processing chambers served by a common workpiece handling unit. The station of the present invention may find use in the mass production of high density interconnect for integrated circuits.

BACKGROUND OF THE INVENTION

In present ULSI (ultra-large-scaled-integration) structures, high circuit speed, high packing density and low power dissipation are essential. As a result, feature sizes must be scaled downward, and the interconnect related time delays become the major limitation. Elemental aluminum and its alloys have been the traditional metals used to form lines and plugs in IC's; however, aluminum has a relatively high resistivity and its electromigration susceptibility can lead to the formation of voids in the metal lines. Therefore copper has been considered as a replacement material to aluminum in interconnect metallurgy system due to its lower resistivity and higher reliability. Replacing current aluminum interconnect materials by copper has become a critical goal for semiconductor manufacturers especially for sub-quarter micron devices.

However, there are serious problems related to process integration of copper to integrated circuits. It is difficult to pattern and remove copper by dry etching, because its reaction product is not gaseous. The conventional approach of depositing a film and then patterning it cannot be relied upon for producing copper interconnections on substrates. Another problem lies in copper's extremely high diffusivity in silicon dioxide, and minute amount of diffused copper atoms in the transistors' active regions will play havoc with their device characteristic.

To solve the above stated problems, "damascene" method has been applied effectively, whereby a pattern of interconnection grooves is first etched in the surface of a layer of oxide dielectric; and the surfaces of grooves are coated first with a thin barrier and seed layers and then filled with copper. The unwanted copper metal on the substrate surface is then removed from the surface by a CMP (chemical-mechanical polish) process. However, as the width of interconnections becomes thinner, these grooves would have a higher aspect ratio. There is great difficulties to fill them using conventional means.

It is known that metal films can be deposited using a variety of processes such as CVD (chemical vapor deposition), PVD (physical vapor deposition), electroplating, and electroless plating. Of these techniques, electroplating and electroless plating are the most economical and promising. At present, electroplating is the more mature technology and is being applied in development and production of 0.18–0.13 $\mu$m copper lines in IC circuits, using exclusively the damascene method for Cu delineation. However, it is apparent that the electroplating technique has its limitations in further scaling down the geometry of the device. To pre-condition an electroplating step, a thin but continuous metallic seed layer must first be deposited on the substrate by another method for the purpose of current conduction. Utilization of a limited number of discrete contacts with the seed layer at the perimeter of the wafer usually produces higher current densities at the contact points than at other portion of the wafer; non-uniformity of voltage drop on the wafer surface in turn causes non-uniformity in the deposits of plated material's thickness. Although this non-uniformity can be compensated by the provision of additional electrically conductive elements at the wafer periphery, it adds to the complexity of equipment, and increases costs of production.

As the geometries of circuits are scaled down further, the sizes of features such as vias and trenches also are reduced. As a result, it becomes more difficult to provide continuous barrier and seed layers. In addition, the thickness ratio of the seed layers in the trenches will become disproportionally larger as compared to the copper layer thickness in the trenches; keeping this ratio constant will aggravate the non-uniformity of the electro-plated film.

Electroless plating is a deposition process for metals on a catalytic surface from an electrolyte solution without an external source of current. Electroless deposition has always been processed in a batch mode because its deposition rate is usually very low. It has always been deposited in a big tank with multiple work pieces in order for the process to be economically viable.

Since single wafer and clustered systems for IC processing have become the common and prevailing trend in the IC industry, big open tanks with processing chemicals as required by the electroless plating process are not compatible or easily implemented in IC fabs, and are wasteful of the expensive ultra-clean fabrication space because of their large footprint.

Both the electro- and electroless plating techniques suffer from a common problem because their operations usually take place in open electrolyte baths. When wafers are transferred from the baths to be cleaned, foreign particles tend to be deposited on the surface of the substrate and oxidation of the catalytic surface in the exposure to air may result in poor catalytic activity and poor metal deposits. Another common problem is the possible occurrence of non-wetting of deep and narrow trenches or holes in the substrate surface because of liquid evaporation. It is more desirable not to transfer the wafer between the process steps and to avoid exposing the wafer to air by using a single processing bath; and to move the different fluids for each step in the process through the process chamber.

The above problem are being addressed by the system described in U.S. Pat. No. 5,830,805 issued in 1998 to Y. Shacham-Diamond, et. al. This patent discloses an electroless deposition apparatus and method, whereby electroless deposition on a wafer takes place in a closed process chamber. It is thus possible to subject the wafer to more than one processing fluids and processing steps while retaining it within the chamber. The invention is useful for manufacturing processes that include depositing, etching, cleaning, rinsing, and drying. The process chamber used in the preferred embodiments of the apparatus of the above patent is an enclosed container capable of holding one or more semiconductor wafers. In spite of their advantages, the embodiment for a single wafer chamber suffers from the shortcoming of low wafer throughput and would be unsuitable for the manufacturing environment. Their batch processing embodiment, on the other hand would have a issue of film thickness uniformity control within the wafer and from wafer to wafer.

U.S. Pat. No. 6,322,677 issued in 2001 to D. Woodruff, et al. discloses a lift and rotate assembly for use in a workpiece processing station and a method of attaching the same. The lift and rotate assembly includes a body having a slim profile and pins located on opposite sides for mounting the assembly onto a tool frame. The lift and rotating assembly further includes a rotating mechanism coupling a processing head to the body, and for rotating the process head with respect to the body. The rotating mechanism includes a motor, wherein the motor is located within the processing head and the shaft of the motor is coupled to and rotationally fixed with respect to the body. The lift and rotate assembly further includes a lift mechanism for lifting the process head with respect to the body. A cable assembly within the lift and rotate assembly includes a common cable loop for feeding additional length of cable along both the lift direction and the rotational direction of movement. The station contains a plurality of processing chambers arranged in two parallel rows with an object handling unit moveable on the tracks between the rows of the processing chambers. In order to load and unload the objects into and from the individual processing chambers, it is necessary to open the top cover of each chamber and to transfer the object using the transport mechanism with a complicated trajectory of an object-handling mechanism. Such an arrangement is purely linear and cannot rationally use the floor space of the clean room.

U.S. Pat. No. 6,267,853 issued in 2001 to Y. Dordi, et al. discloses an electro-chemical deposition system which generally comprises a mainframe having a mainframe wafer transfer robot, a loading station disposed in connection with the mainframe, one or more processing cells disposed in connection with the mainframe, and an electrolyte supply fluidly connected to the one or more electrical processing cells. Preferably, the electro-chemical deposition system includes an edge bead removal/spin-rinse-dry (EBR/SRD) station disposed on the mainframe adjacent the loading station, a rapid thermal anneal chamber attached to the loading station, a seed layer repair station disposed on the mainframe, and a system controller for controlling the electro-chemical deposition process and the components of the electro-chemical deposition system. In fact, this is a cluster tool station with various functional units arranged around a common object transfer mechanism for transferring objects between various functional units in accordance with a required sequence. A disadvantage of the aforementioned arrangement that the entire cluster machine can be placed into the clean room only as an indivisible or integral system which does not allow placement of those units which otherwise could be placed into a service area beyond the boundaries of the expensive clean-room floor space.

The same disadvantages as in Dordi's, et al. invention are inherent in the substrate plating apparatus disclosed in U.S. Pat. No. 6,294,059 issued in 2001 to A. Hongo, et al. The apparatus includes a plating unit for forming a plated layer on a surface of the substrate including the interconnection region, a chemical mechanical polishing unit for chemically mechanically polishing the substrate to remove the plated layer from the surface of the substrate leaving a portion of the plated layer in the interconnection region, a cleaning unit for cleaning the substrate after the plated layer is formed or the substrate is chemically mechanically polished, a drying unit for drying the substrate after the substrate is cleaned, and a substrate transfer unit for transferring the substrate to and from each of the first plating unit, the first chemical mechanical polishing unit, the cleaning unit, and the drying unit. The first plating unit, the first chemical mechanical polishing unit, the cleaning unit, the drying unit, and the substrate transfer unit are combined into a unitary arrangement. In other words, similar to the previous patents, the station of U.S. Pat. No. 6,294,059 can also be classified as a cluster-tool station with a common robot which serves different functional units combined into an indivisible unity.

OBJECTS AND SUMMARY OF THE INVENTION

It is an object of the present invention to provide a processing station that contains a plurality of individual and independently operating processing chambers arranged in mutiple-level manner vertically and in linear rows horizontally with transfer of objects by means of by a common workpiece handling unit. It is another object is to provide the aforementioned station suitable for electroless deposition in the mass production of semiconductor wafers with high interconnect density. A further object is to provide the aforementioned station which is universal in use, flexible for restructuring in accordance with specific production requirements, highly efficient in production due to parallel operation of a plurality of chemical processing chambers in accordance with a required sequence, and occupying a reduced floor area due to the use of a common industrial robot for transferring objects between the service area and the equipment of the clean room. It is another object to provide the aforementioned station in which a maximum possible amount of equipment units can be transferred from the clean room to the service area thus reducing the floor space occupied by the equipment in the clean-room area. It is a further object to provide a chemically processing station with spatial arrangement of interacting station units, such as processing modules, wafer cassettes, and a wafer-handling unit.

The present invention discloses a station, e.g., for IC fabrication with a flexible configuration. It consists of an array of processing chambers, which are grouped into processing modules and arranged in a two dimensional fashion, and is capable of operating independent of each other. Each processing chamber can perform electroless deposition and other related processing steps sequentially on a wafer with more than one processing fluids without having to remove it from the chamber. The system is served by a two-tiered fluid distribution and delivery system. Only one robot arm is employed which can be randomly accessed and transport wafers between the wafer cassettes and any of the processing chambers. If necessary, the station can be arranged in a three-dimensional pattern.

In summary, the deposition system consists of:
1. A single-wafer processing tool.
2. A single-robot system to handle multiple wafer cassettes (FOUPs [Front Opening Unified Pods] or SMIF [Standard Mechanical Interface] boxes) and multiple processing modules.
3. Multiple (single-wafer) processing chambers in a processing module.
4. Each processing chamber is able to perform different processing steps with different chemicals without the need of moving the wafer to a different processing chamber.
5. Each processing chamber is capable of receiving a clean wafer from the wafer cassette and then return a clean wafer back to a wafer cassette, after all the required processing steps are completed.
6. Each processing chamber is isolated from the Front end (and therefore from the clean room) with a specially designed gate valve suitable for receiving and discharging semiconductor wafers.

7. Each processing module contains a Fluid Distribution Unit that supplies processing chemicals to the multiple processing chambers in the module.

8. Each processing module contains a power electronics unit and controls/communications electronics unit servicing multiple processing chambers within one processing module.

9. A remote Chemical Distribution Module that supplies processing chemicals to multiples of Fluid Distribution Units (or processing modules).

10. The new system configuration results in the smallest possible equipment size for a relatively slow process than any other electroless deposition tool; this design will also result in lower cost and higher system reliability.

DETAILED DESCRIPTION OF THE INVENTION

This invention discloses an equipment configuration which is both novel and flexible, for the electroless deposition of copper, a passivation layer, and a barrier layer. The apparatus consists of a number of processing modules and each module in turn comprises a number of process chambers. At least one of the chambers is capable of depositing thin metal films by electroless means. All necessary processing steps for film deposition are performed in a single processing chamber. Thus, the unit provides a way of reducing the number of times the wafer needs to be transferred between wet steps.

Figure 1:
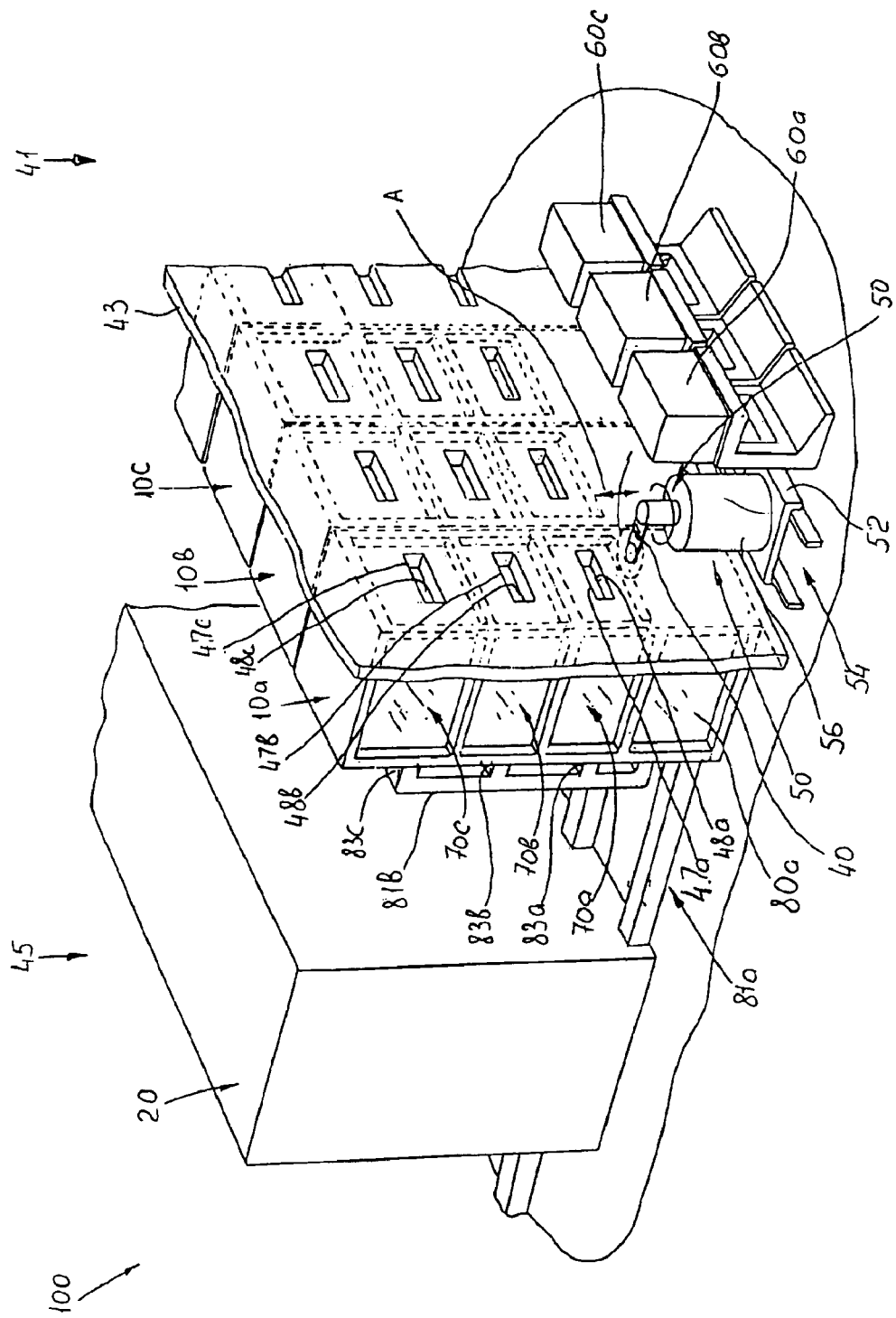
FIG. 1 is a three-dimensional general view of a spatially-arranged single-wafer chemical processing station of the invention.

Reference is made to FIG. 1, which is a three-dimensional general view of a single-wafer electroless deposition station (hereinafter referred to as "system") of this invention. The system is designated as a whole by the reference numeral 100. The system consists of a multiple number of processing modules 10a, 10b, 10c, etc arranged in a line in a horizontal manner (only three of them are shown), and divided among them a multiple number of processing chambers 70a, 70b, 70c, etc. which are arranged in a vertical manner by way of an example, although the manner of their arrangements is immaterial. The system also contains a number of wafer cassettes or FOUPs 60a, 60b, 60c, etc. which are arranged horizontally in line parallel to the processing modules 10a, 10b, 10c, etc.

A wafer handling unit 50, which is installed on a carriage 52, is guided along guide rails 54 in space between the FOUPs 60a, 60b, 60c, etc. and the processing modules 10a, 10b, 10c, etc. The wafer handling unit has a rotatable mechanical arm 40 which can be rotated in a horizontal plane and moved in a vertical direction shown by arrow A from a drive unit 56 for transfer of the wafers between the FOUPs 60a, 60b, 60c, etc. and the processing modules 10a, 10b, 10c, etc. and for vertical alignment with respective processing chambers 70a, 70b, 70c, etc.

If necessary, the mechanical arm 40 can be rotated 360°. Thus wafers can be transported from the cassettes 60a, 60b, 60c, etc. to selected processing chambers 70a, 70b, 70c for processing, and extracted and returned to the cassettes when their required operations are completed. It is understood that the FOUPs 60a, 60b, 60c, etc. and the robot with the mechanical arm 40 are located in an enclosed clean environment (clean room 41), while the modules 10a, 10b, 10c, etc., solution storage tanks, etc. are located in a service area 45 which is separated from the clean room 41 by a wall 43 having windows 47a, 47b, 47c, Etc. aligned with specially designed gate valves 48a, 48b, 48c, etc. of respective chemical processing chambers 70a, 70b, 70c, etc. suitable for loading and unloading semiconductor wafers.

Working solutions and other fluids such as cleaning, activation, or similar liquids are supplied to the respective processing chambers 70a, 70b, 70c, etc. from a respective chemical distribution and supply unit (hereinafter referred to as "chemical supply unit") 80a under control of a chemical management unit 20 (FIG. 1).

The disclosed configuration of an arrayed processing chambers 70a, 70b, 70c, etc. has many advantages:

1) Since all processing chambers 70a, 70b, 70c, etc. are equivalent, there is a great flexibility in the tradeoff between wafer throughput and the number of processing modules needed. We can program the optimum number of wafers that undergo identical process sequence at the same time versus the number of different processing sequences at any one time.

2) The chambers 70a, 70b, 70c, etc. can be randomly accessed by vectoring the robot arm 40 to the target process chamber through the movements of the vertical/rotary drive 56 on the guide rails 54. Thus, the access times to any processing chamber are about equal and minimized.

3) The machine will never have to be shut down by the failure of one or more processing chambers 70a, 70b, 70c, etc. since they are all equivalent. The machine can still be used with almost normal performance efficiency and degrades gracefully, until it can be repaired at a convenient time.

For each processing module 10a, 10b, 10c, etc. there are a set dedicated local chemical supply units of the type shown by reference numeral 80a in FIG. 1. Since all chemical supply units are essentially identical, the following description will relate only to the chemical supply unit 80a and units associated therewith. More specifically, the chemical supply unit 80a is connected by pipe lines 81a with a central chemical supply tanks in a remote chemical management unit 20. In FIG. 1, reference numeral 81b designates a pipe holder which contains individual pipes that connects the chemical supply unit 80a with chemical processing chambers 70a, 70b, 70c, etc. of the processing module 10a through individual pipe branches 83a, 83b, 83c, etc. which constitute a local piping distribution system. In general, the main chemical management unit 20 is located in the service area.

The particular features and embodiments of the fluid distribution and delivery systems and method of their operation are disclosed in more detail in earlier U.S. patent application Ser. No. 10/103,015 filed by the same applicant on Mar. 22, 2002.

Figure 2:
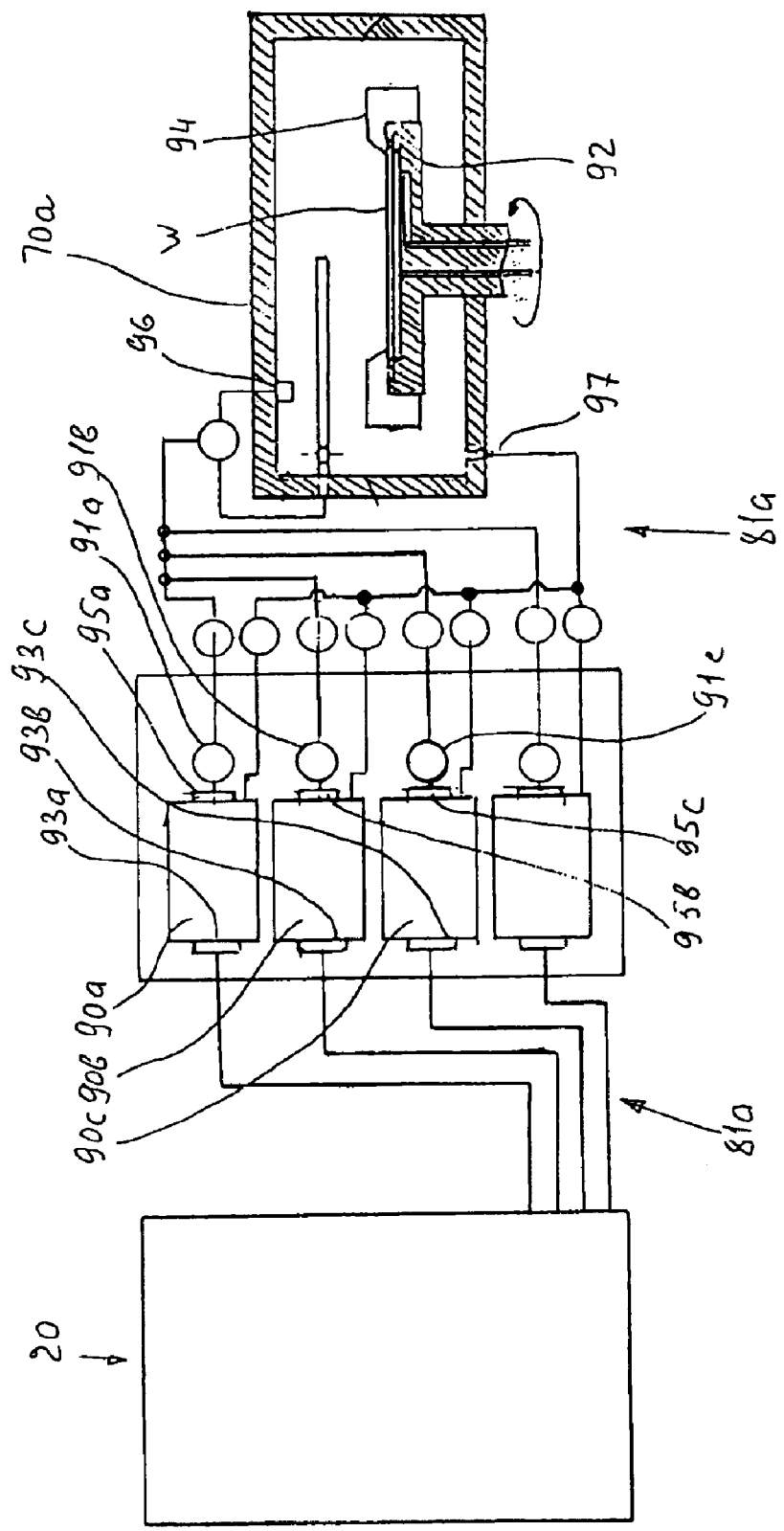
FIG. 2 is a more detailed view of the piping arrangements for the supply of liquids to and from the process chambers of the station.

The piping arrangements to and from the process chambers are shown in greater detail in FIG. 2. The chemical supply unit 80a contains a plurality of individual fluid tanks 90a, 90b, 90c, etc. for specific liquids used in the process. For example, the tank 90a may contain a chemical working solution for electroless deposition, the tank 90b may contain a wetting liquid for wetting the surface of the wafer in the initial period of the process, the tank 90c may contain a cleaning liquid such as a deionized water, etc. The respective liquids are supplied to the tanks 90a, 90b, 90c, etc. from respective storage tanks (not shown) of a main chemical management unit 20. From the chemical supply unit 80a the liquids are supplied to the chemical processing chamber 70a in a required sequence controlled, e.g., by a controller (as described in the aforementioned earlier patent application) through the individual pipe branches 83a, 83b, 83c . . . . Chemical supply unit 80a also contains hydraulic pumps 91a, 91b, 91c, etc. for the supply of fluids from respective tanks 90a, 90b, 90c, etc. to respective chemical processing chambers. For loading and unloading the fluids into and from the tanks, they are provided with fluid inlet ports and outlet ports (only the inlet port 93a and the outlet port 95a of the tank 90a are shown in FIG. 2). Similarly, chemical processing chambers have an fluid inlet opening and a fluid outlet opening (only the inlet opening 96 and an outlet opening 97 of the chemical processing chamber 70a are shown in FIG. 2).

Both the local storage tanks 90a, 90b, 90c, etc. and the respective storage tanks of the main chemical management unit 20 have their individual recirculation loops (not shown) for constant circulation of the fluids between the bottom to the top level of the same tank, with the individual attendant pumps and filters (not shown). The fluid content of each tank is constantly being filtered and its composition monitored in-situ and replenished in the chemical management unit 20.

As described in detail in the aforementioned previous U.S. patent application, each chamber contains a substrate holder 92 (FIG. 2), which can be rotated around a vertical axis at various angular speeds, and an edge-grip mechanism 94 located inside the substrate holder for rotation therewith. Wafer rotation is used to facilitate drying, or a more uniform deposit. The wafer W on the holder 92 may be totally immersed in the solution, or the fluid may be sprayed through nozzles 96 at the end of the inlets while the substrate holder rotates. Also, for certain special processing requirements, the chamber may be pumped to vacuum, or be pressurized to several atmospheric pressure. All these features are beyond the scope of the present patent application.

The system of this invention is designed in such a way that once a wafer is placed in the sealed processing chamber 70a (or 70b, 70c, etc.), it can undergo a series of sequential processing steps by supplying and removing the respective liquids into and from the chemical processing chamber until a clean wafer with a finished film is outputted. Depending on the accessory features of the chamber, the desired processing steps may be, but certainly not limited by, Pd activation, deposition of a barrier layer, deposition of Cu by electroless methods, electro-polishing, annealing, rinsing and drying. What is important to note that the arrangement of units according to the invention would cut down processing time and reduce oxidation and contamination due to the simultaneous use of a plurality process modules which contain independently operating individual chemical processing chambers serviced by a common wafer handling unit 40. Each process chamber is capable of performing multiple processing steps to complete the deposition process without the need of transferring the wafer between different processing chambers.

Figure 3:
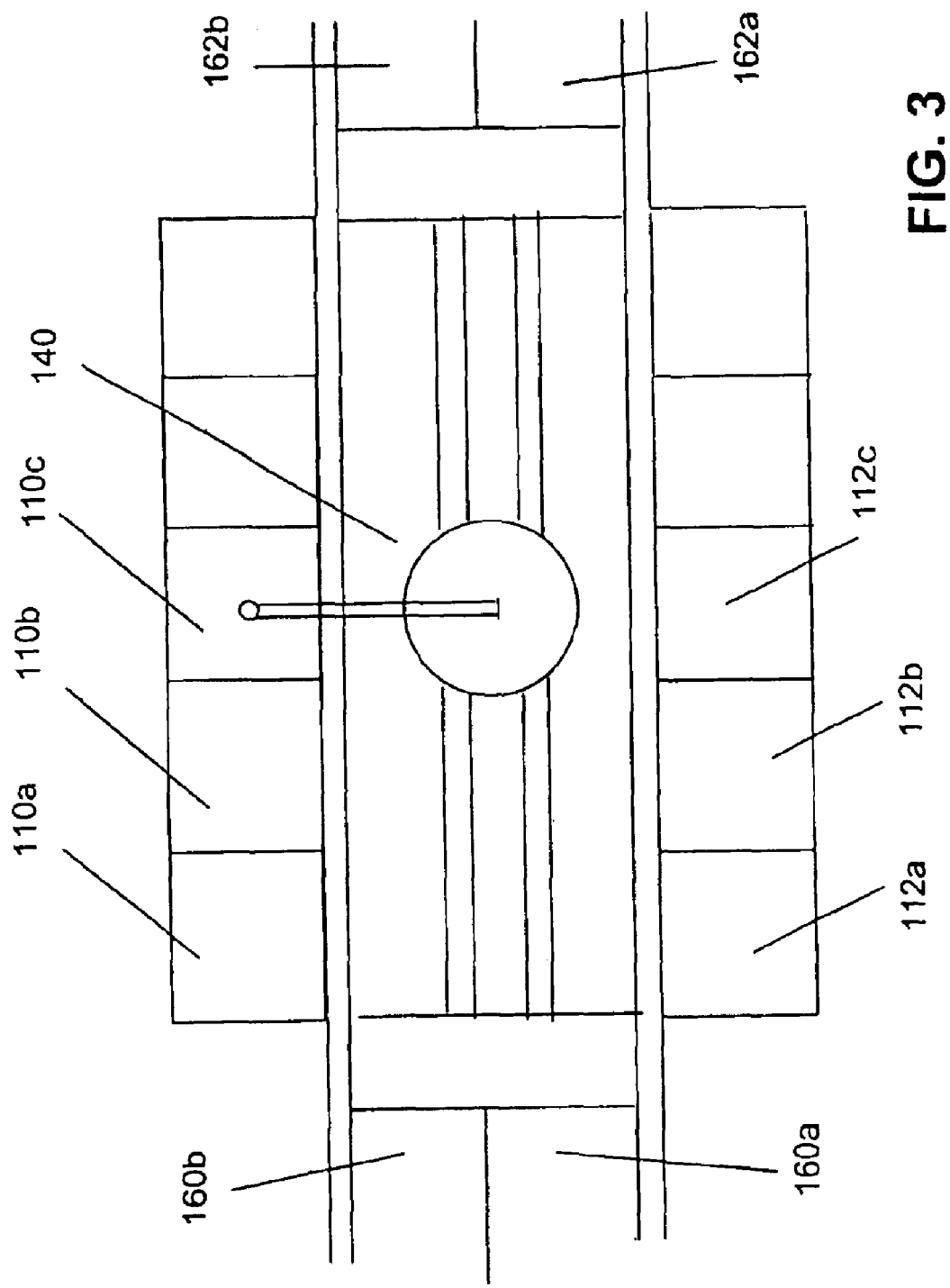
FIG. 3 is a top view on a chemical processing station of the invention having a three-dimensional arrangement of the station units.

FIG. 3 is a top view on a chemical processing station of the invention having a three-dimensional arrangement of the station units. This is the most optimal way for utilization of the working space. In this arrangement, a multi-tiered modules 110a, 110b, 110c, etc. and multi-tiered modules 112a, 112b, 112c, etc. are located in a service area and organized into two parallel rows. These rows are separated by a clean room, which contains an industrial robot 140. Wafer cassettes or FOUPs 160a, 160b and 162a, 162b are arranged in rows which are perpendicular to the direction of module rows. Thus, the robot 140 is located in a confined space formed by the chemical processing modules and wafer cassettes. In fact, such an arrangement comprises a version of a multi-tiered cluster tool.

Thus it has been shown that the invention provides a chemical processing station that contains a plurality of individual and independently operating chemical processing chambers served by a common workpiece handling unit. The aforementioned station is suitable for electroless deposition in the mass production of semiconductor wafers with high interconnect density. It is universal in use, flexible for restructuring in accordance with specific production requirements, highly efficient in production due to parallel operation of a plurality of chemical processing chambers in accordance with a required sequence, and occupying a reduced floor area due to the use of a common industrial robot for transferring objects between the service area and the equipment of the clean room. Transfer of some units of equipment from the clean room to the service area makes it possible to significantly reduce the floor space occupied by the equipment in he clean room. A multiple-layer arrangement of the chambers provides the most efficient use of the clean-room production area.

It is to be noted that a conventional cluster-tool processing station commonly employed in the IC factories does not allow separation of any functional units and relocation of these units from beyond the reach by the industrial robot. Furthermore, such conventional stations are always use at least two robot arms—one for picking up wafers from the FOUP to a pedestal in the transport chamber, and another for carrying them from the transport chamber to the processing chambers. By eliminating one of the robot arms, and the transport chamber which usually has a relatively large volume, the apparatus footprint is significantly reduced, the equipment is simplified; furthermore, since excessive wafer transfers using second robot are eliminated, the processing time per wafer is also reduced.

Having thus described exemplary embodiments of the present invention, it should be noted by those skilled in the art that the disclosures within are exemplary only and that various other alternatives, adaptations and modifications may be made within the scope of the present invention. For example, the system may be configured with different number of modules, chambers in the modules, tanks in the chambers. The wafer cassettes may be different from FOUPs. The system of the invention is applicable not only for electroless deposition but for other processes, such electrodeposition, or the like. The wafer handling unit may be represented by different industrial robots equipped with different edge grippers. The system is applicable to handling objects other than semiconductor wafers, e.g., for CD disk substrate, or hard-drive disk substrates. If necessary, the entire station as a whole can be installed in a clean room.

What is claimed is:

1. A chemical processing station for processing objects comprising:

a plurality of processing modules arranged in a horizontal manner one after the other, wherein each processing module comprises:

a plurality of chemical processing chambers arranged in a predetermined sequence, each chemical processing chamber having:

a rotatable object holder located inside said each chemical processing chamber and capable of holding and rotating said objects;

an inlet/outlet opening in said each chemical processing chamber for loading/unloading said objects into and from said each chemical processing chamber;

at least one inlet port for the supply of at least one processing fluid into said each chemical processing chamber; and at least one outlet port for discharging said at least one processing fluid from said each chemical processing chamber;

local chemical supply unit containing at least one storage tank and having:

a tank outlet port connected to said at least one inlet port of said each chemical processing chamber; and a tank inlet port connected to said at least one outlet port of said each chemical processing chamber;

at least one fluid pump for the supply of said at least one processing fluid from said at least one storage tank to said each chemical processing chamber; and a local piping distribution system for transporting said at least one processing fluid between said at least one storage tank and said each chemical processing chamber;

a plurality object storage units containing a plurality of said objects arranged parallel to said processing modules;

an object handling unit located between said the plurality of processing modules and said plurality of object storage units, wherein the object handling unit is provided with means for gripping said objects and for transferring said objects between said inlet/outlet opening of said each chemical processing chamber; and a main chemical management unit connected to said local chemical supply unit through pipelines, said chemical processing station occupying a production floor space.

2. The chemical processing station of claim 1, wherein said each chemical processing chamber is a single-wafer electroless deposition chamber.

3. The chemical processing Station of claim 1, wherein said plurality of chemical processing chambers are arranged in vertical manner one above the other.

4. The chemical processing station of claim 1, wherein said object handling unit comprises an industrial robot with a mechanical arm provided with a rotary drive for rotating said mechanical arm between said each chemical processing chamber and said plurality of object storage units and with a linear drive for moving said mechanical arm for reaching said inlet/outlet opening of said each chemical processing chamber in said predetermined sequence.

5. The chemical processing station of claim 1, wherein said predetermined sequence is a vertical arrangement.

6. The chemical processing station of claim 1, wherein said floor space comprises a service-room floor space and a clean-room floor space, said plurality of processing modules and said main chemical management unit connected to said local chemical supply unit occupy the service-room floor space, while said plurality of object storage units that contains a plurality off said objects and said object handling unit occupy the clean-roam floor-space.

* * * * *

UNITED STATES PATENT AND TRADEMARK OFFICE
CERTIFICATE OF CORRECTION

PATENT NO.     : 6,939,403 B2
DATED          : September 6, 2005
INVENTOR(S)    : Ivanov et al.

It is certified that error appears in the above-identified patent and that said Letters Patent is hereby corrected as shown below:

Title page,
Item [75], Inventors, delete "Arthur Kolics" and substitute -- Artur Kolics --.

Column 10,
Line 26, delete "off" and substitute -- of --.
Line 27, delete "clean-roam" and substitute -- clean-room --.

Signed and Sealed this

Seventh Day of March, 2006

JON W. DUDAS
*Director of the United States Patent and Trademark Office*